(12) United States Patent
Lee

(10) Patent No.: US 7,683,466 B2
(45) Date of Patent: Mar. 23, 2010

(54) CHIP PACKAGING OVERFLOW PROOF DEVICE

(75) Inventor: Ming-Shun Lee, Taipei (TW)

(73) Assignee: Taiwan Oasis Technology Co., Ltd., Taipei (TW)

( * ) Notice: Subject to any disclaimer, the term of this patent is extended or adjusted under 35 U.S.C. 154(b) by 523 days.

(21) Appl. No.: 11/600,917

(22) Filed: Nov. 17, 2006

(65) Prior Publication Data

US 2008/0079137 A1 Apr. 3, 2008

(30) Foreign Application Priority Data

Sep. 29, 2006 (TW) .............................. 95217445 U

(51) Int. Cl.
*H01L 23/495* (2006.01)

(52) U.S. Cl. ........................... 257/676; 257/99; 257/98; 257/79; 257/E51.018; 257/E51.022; 313/486; 313/487; 313/498

(58) Field of Classification Search ................ 257/100, 257/676, 79, 99, 103, 98, 687, 710, 789, 257/102, E51.018, E51.022; 313/486, 487, 313/498

See application file for complete search history.

(56) References Cited

U.S. PATENT DOCUMENTS 6,495,083 B2 * 12/2002 Weber .................... 264/272.15
2007/0102717 A1 * 5/2007 Lee et al. ....................... 257/98

* cited by examiner

*Primary Examiner*—Zandra Smith
*Assistant Examiner*—Telly D Green
(74) *Attorney, Agent, or Firm*—Jackson IPG PLLC

(57) ABSTRACT

A chip packaging overflow proof device includes a chip disposed on a substrate; a circuit connected to the chip being provided to each of both sides of the substrate; both of the substrate and the chip being placed in a packaging base; a socket being each provided on both sides of the packaging base to receive insertion by a lid; a first cable-terminating hole being provided between the socket and the lid to permit the circuit to penetrate through; one or a plurality of retaining wall being disposed on the packaging base at where closer to the socket; a second cable-terminating hole being provided on the retaining hole; an overflow space being defined between the retaining wall and the socket; the overflow space being disposed at a level lower than that of the second cable-terminating hole; and the overflow space accepts any squeeze-out from a chip packaging colloid.

16 Claims, 8 Drawing Sheets

US 7,683,466 B2

CHIP PACKAGING OVERFLOW PROOF DEVICE

BACKGROUND OF THE INVENTION (a) Field of the Invention

The present invention is related to a chip packaging overflow proof device, and more particularly to a package base including an overflow space to contain squeeze-out.

(b) Description of the Prior Art

The conventional manufacturing process for semiconductor package with lead frame as a chip carrier, e.g., Quad Flat Package (QFP) or Quad Flat Non-Leaded (QFN) involves having the lead frame provided with a chip base and multiple guide pins to be adhered with a semiconductor chip; the lead frame is then electrically connected to a solder pad and multiple corresponding connection pins with multiple golden plated wires, and finally a packaging colloid is provided to encapsulate the chip and those golden plated wires to form a semiconductor package. Meanwhile, on surface of the chip base may be exposed out of the packaging colloid for the chip base to facilitate dissipating the heat built up on the chip.

Referring to FIGS. 1 and 2 of the accompanying drawings for a process of packaging multiple chips, each chip 11 is disposed on a same substrate 12 and the substrate 12 is related to a circuit board with both sides disposed with circuits 13. The substrate 12 and multiple chips 11 are placed in a packaging base 14. Both sides of the packaging base 14 are respectively provided with a socket 15 to receive insertion by a lid 16. A cable-terminating hole 17 is disposed at where between the socket 15 and the lid 16 for the circuit to penetrate through. A packaging colloid 18 is filled above the substrate to protect those chips 11 while each chip 11 is activated when the circuit 13 is conducted.

The cable-terminating hole 17 is contained in a first slot 171 with its opening facing upward and disposed at the bottom of each of both sides of the socket 15 and in a second slot 172 with its opening facing downward and disposed on the bottom of each of both sides of the lid 16. Once each lid 16 is inserted into the socket 15, both of the first and the second slots define the substantially circular cable-terminating hole 17 to allow the circuit to penetrate through. Upon filling the packaging colloid 18, squeeze-out occurs on the external side of the packaging base 14 when the colloid 18 is vulnerable to flow out of the cable-terminating hole 17 due to excessively filling amount of colloid 18 or excessively higher viscosity of the colloid 18 as illustrate din FIG. 2. In case of squeeze-out, not only the appearance is compromised and extra process cost is incurred from ridding of the squeeze-out, but also the binding strength between the colloid and the packaging base may be affected.

SUMMARY OF THE INVENTION

The primary purpose of the present invention is to provide a chip packaging overflow proof device containing a packaging base disposed with an overflow space to accommodate squeeze out of colloid.

To achieve the purpose, multiple chips are disposed on a substrate; both sides of the substrate are provided with circuits connecting to those chips; and the substrate and those chips are placed and secured in a packaging base. A socket is provided on each of both sides of the packaging base to receive insertion of a lid, and a first cable-terminating hole is provided at where between the socket and the lid to permit the penetration by the circuit. Wherein, one or a plurality of retaining wall is disposed on the packaging base at where closer to the socket and a second cable-terminating hole is disposed on the retaining wall. An overflow space is defined between the retaining wall and the socket to accommodate any squeeze-out with the bottom of the overflow space at a level lower than that of the second cable-terminating hole so to permit any squeeze-out from a chip packaging colloid to enter into the overflow space without flowing out of the outer side of the packaging base to prevent any squeeze-out from damaging the appearance of the packaging base.

DETAILED DESCRIPTION OF THE PREFERRED EMBODIMENTS

Figure 1:
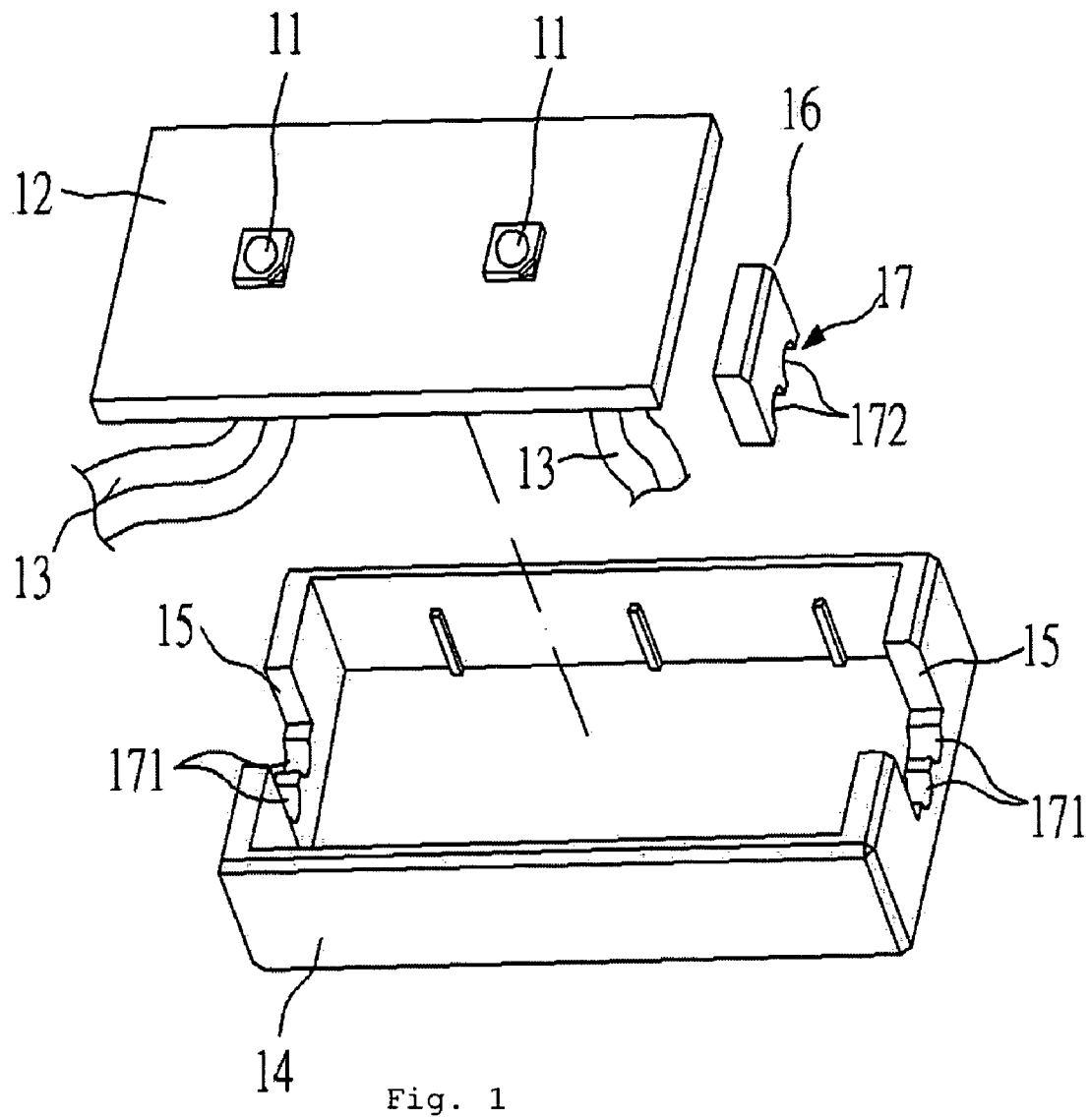
FIG. 1 is an exploded view of a chip packaging construction of the prior art.
Figure 2:
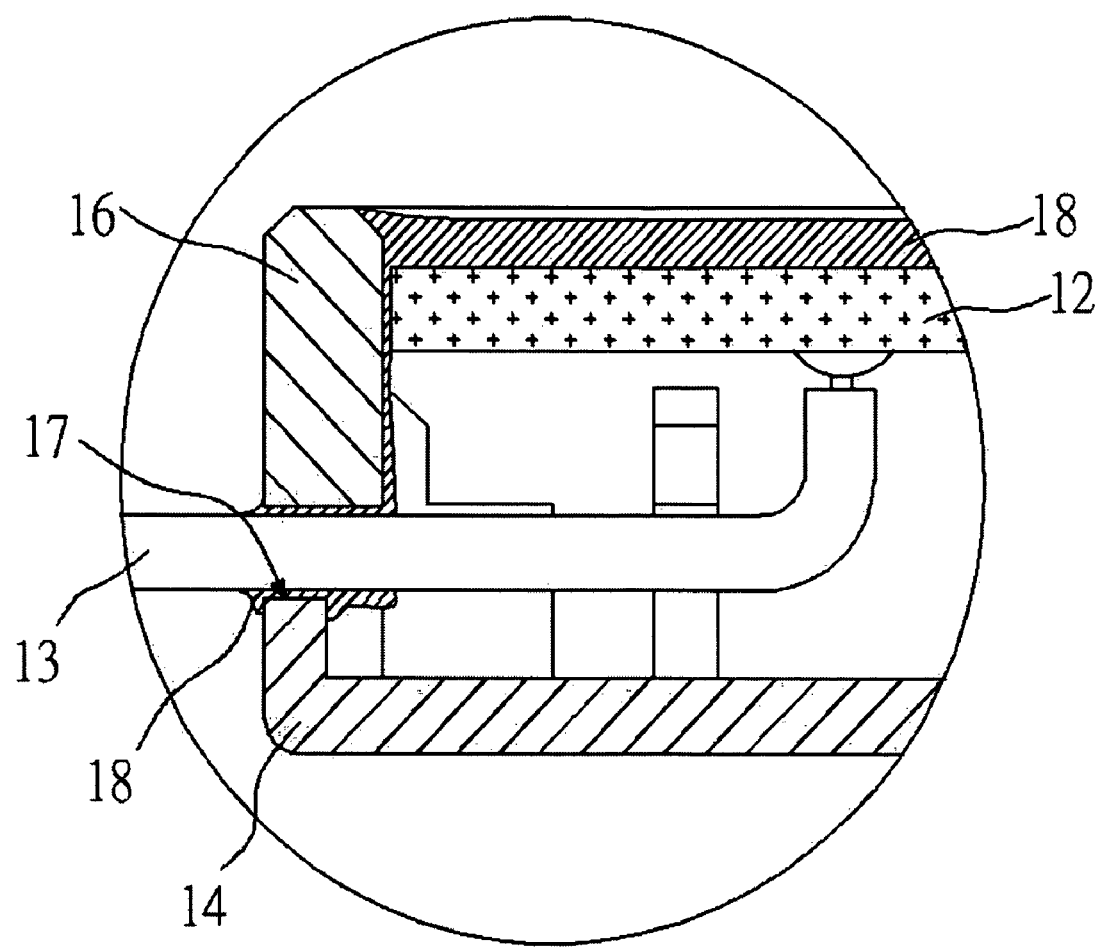
FIG. 2 is a schematic view showing a construction of squeeze-out taking place on the chip packaging process of the prior art.
Figure 3:
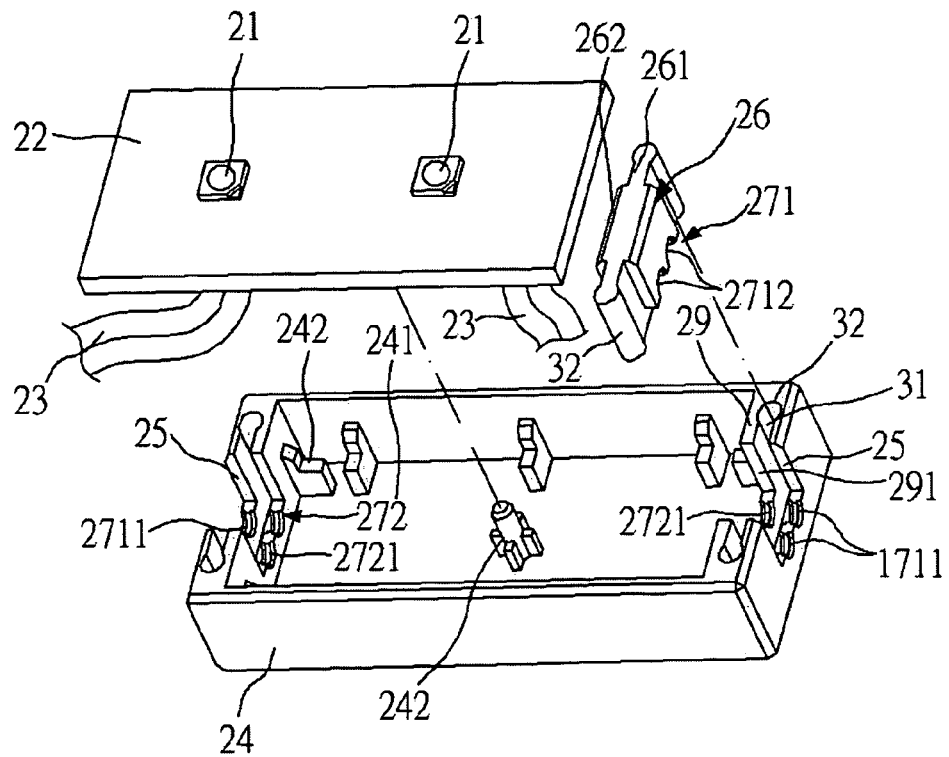
FIG. 3 is an exploded view of chips and packaging base of the present invention.
Figure 4:
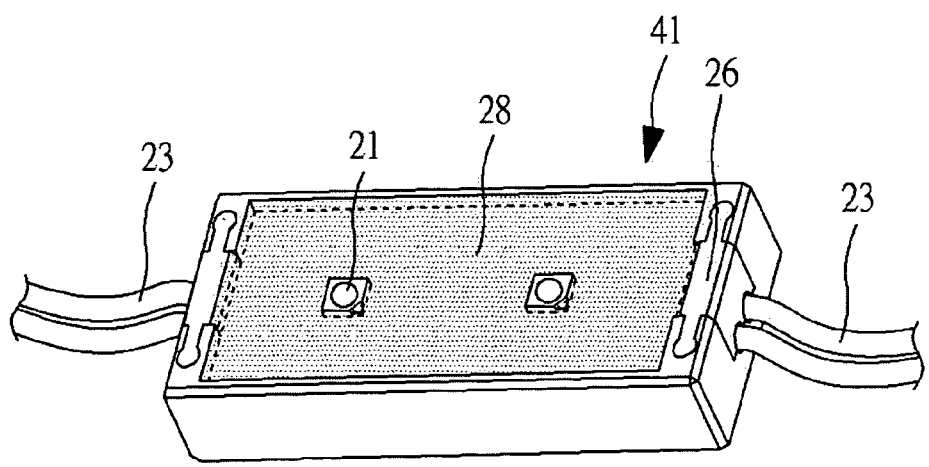
FIG. 4 is a perspective view showing a construction of an light emitting diode (LED) unit in the present invention.
Figure 5:
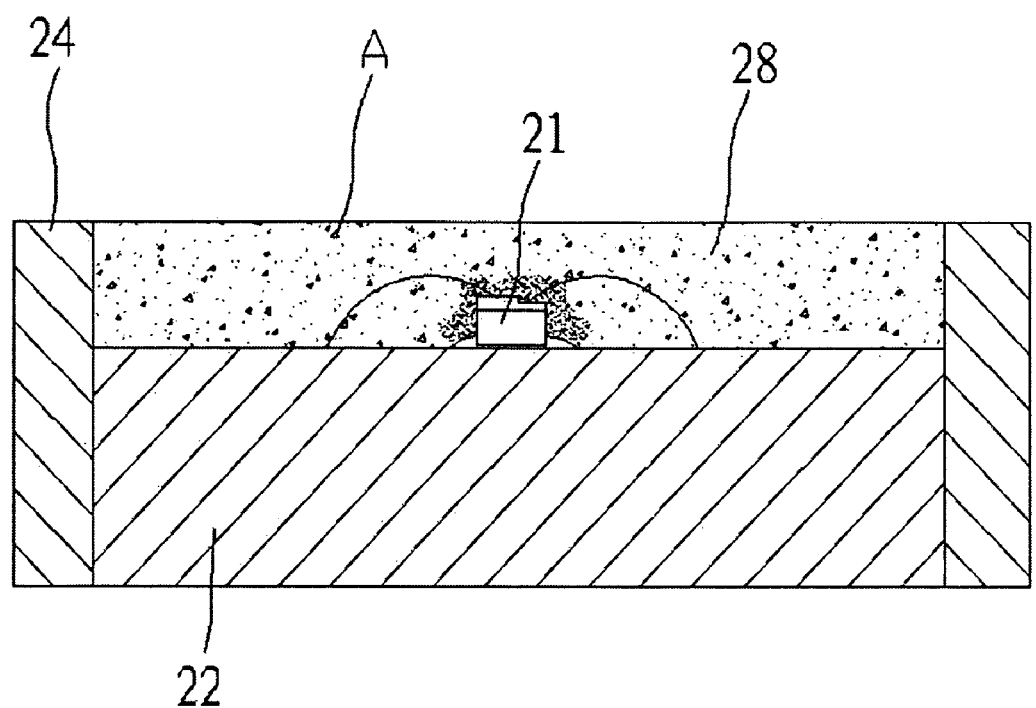
FIG. 5 is a schematic view showing a construction of the LED and a packaging colloid in the present invention.

Referring to FIGS. 3 through 7, a preferred embodiment of chip packaging overflow proof device of the present invention includes multiple chips 21, two chips in the preferred embodiment, disposed on a substrate 22; and the substrate 22 related to a circuit board has both sides each provided with a circuit 23 connected to each chip 21. Both of the substrate 22 and those chips 21 are placed and secured in a packaging base 24; and the packaging base 24 contains a chamber 241 to accommodate the substrate 22 and multiple ribs 242 to secure the substrate 22 in position. Both sides of the packaging base 24 are respectively disposed with a socket 25 to receive insertion by a lid 26. A first cable-terminating hole 271 is provided at where between the socket 25 and the lid 26 to permit the circuit to penetrate through. A packaging colloid 28 to protect each chip 21 is filled at where above the substrate 22. When the circuit 23 is conducted, each chip is activated. Wherein, the chip 21 may be related to a light emitting diode (LED) to emit the light when the chip 21 is activated. One or a plurality of light emitting chip may be disposed on the substrate with each light emission chip to emit light in the same or different light color as or from that of other chips to constitute a light emitting packaging unit 41 as illustrated in FIG. 4. Of course, fluorescent powder A in different color may be added into the packaging colloid 28 to address the light emission performance.

Figure 6:
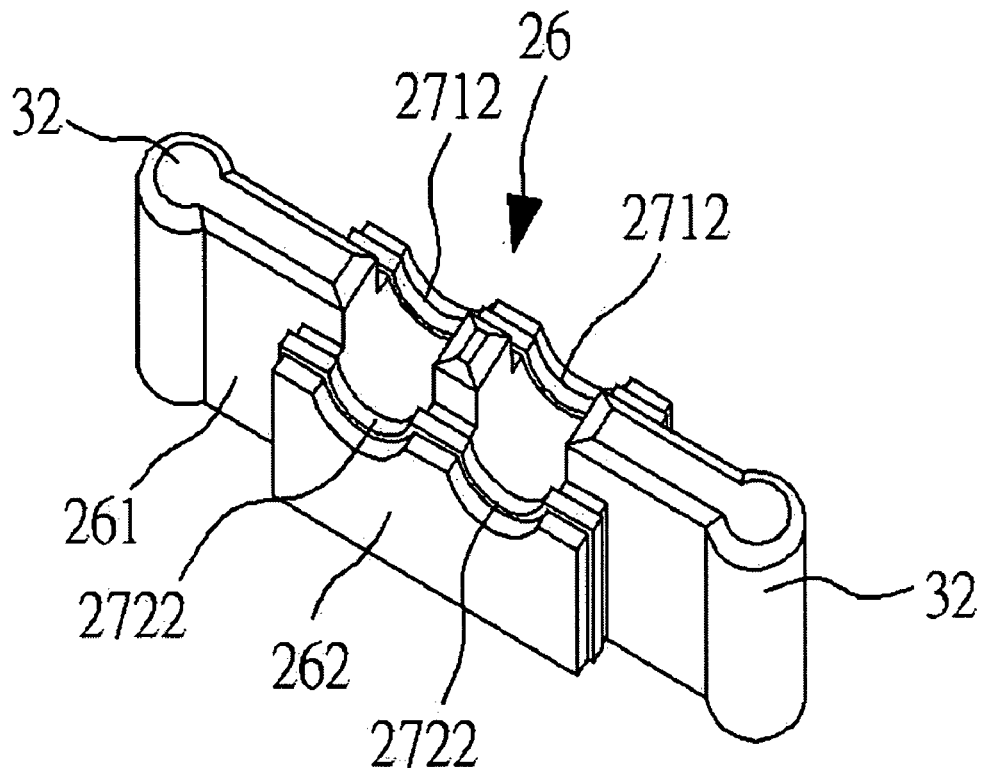
FIG. 6 is a perspective view showing a construction of a lid in the present invention.
Figure 7:
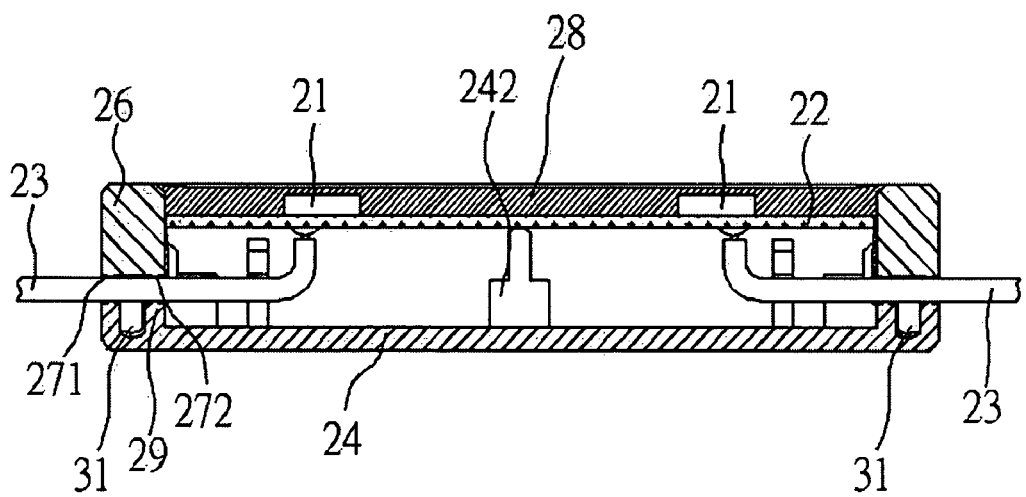
FIG. 7 is a schematic view showing a construction of chips completed with packaging in the present invention.
Figure 8:
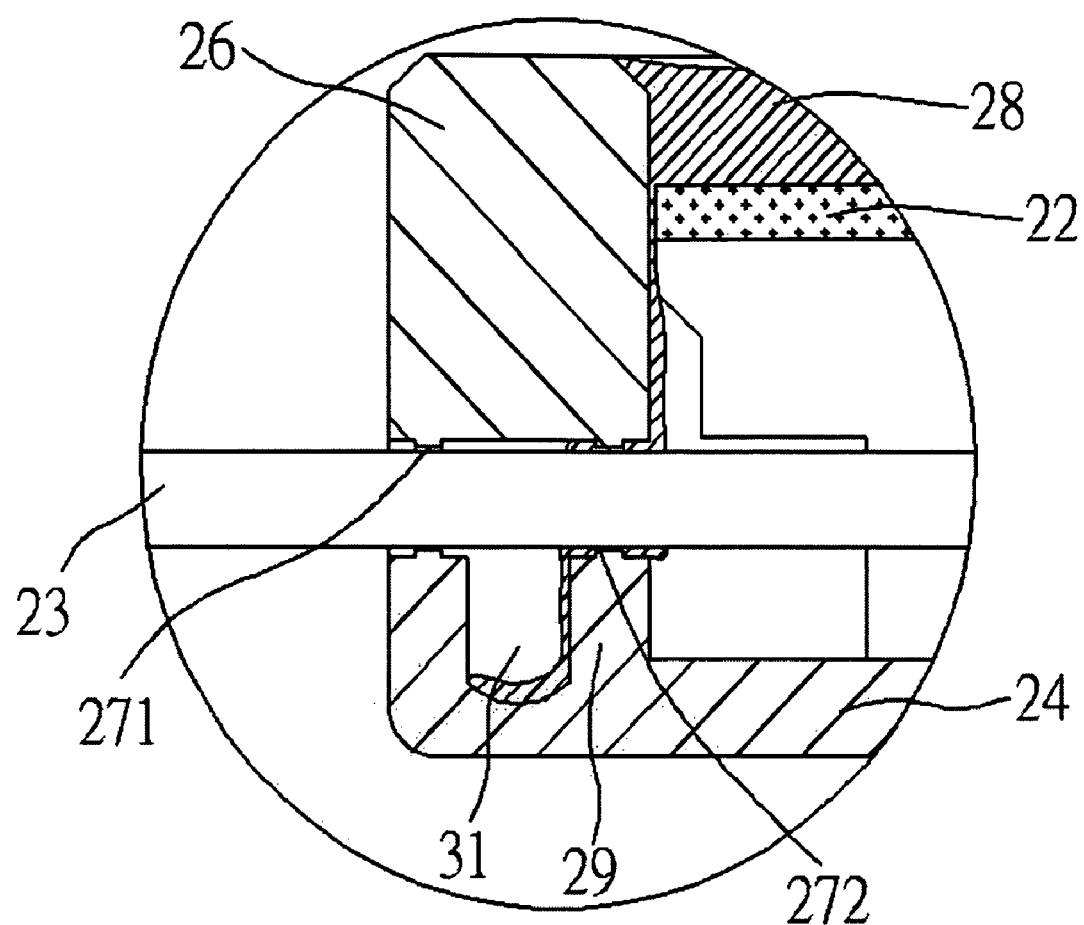
FIG. 8 is a magnified view showing a construction of a local portion taken from FIG. 7.

As illustrated in FIGS. 3, 6, and 7, the first cable-terminating hole 271 contains a first slot 2711 with its opening facing upward disposed on the bottom of each of both sides of the socket 25, and a second slot 2712 with its opening facing downward disposed on the bottom of each of both sides of the lid 26. With the lid 26 inserted into the socket 25, both of the first and second slots 2711, 2712 define the first cable-terminating hole 171 substantially in a circular form. One or a plurality of retaining wall 29 is disposed at where closer to the socket 25 on the packaging base 24. A trough 291 and a second cable-terminating hole 272 are disposed on the retaining wall 291. An overflow space 31 to accommodate any squeeze-out is provided at where between the retaining wall and the socket 25, and the bottom of the overflow space 31 is at a level lower than that of the second cable-terminating hole 272. A first covering portion 261 extending from the lid 26 enters into the overflow space 31. An arc portion 32 is provided between the space 31 and the first covering portion 261 for the overflow space 31 and the first covering portion 261 to be abutted to each other. A second covering portion 262 extending from the lid 26 enters into the trough 291. The second cable-terminating hole 272 is contained in the first slot 2721 with its opening facing upward disposed at the bottom of the trough 291 and the second slot 2722 with its opening facing downward disposed at the bottom of the second covering portion 262.

When assembled, the substrate 22 disposed with multiple chips 21 is placed in the chamber 241 and secured in position by those multiple ribs 242; both circuits 23 on both sides of the substrate penetrate in sequence into the second and the first cable-terminating holes 272, 271 and left exposed out of the packaging base 24. Meanwhile, each lid 26 is inserted into the socket 25 and firmly secured in the packaging base 24 with the arc portion 32 where the overflow space 31 and the first covering portion 261 are abutted to each other. Finally, the packaging colloid 28 is filled in the chamber 241 and above those multiple chips 21 to complete the chip packaging process.

Before filling the packaging colloid 28, the chamber 241 is vacuumed to prevent the packaging colloid 28 from developing any air bulb when filled in the chamber 241 and any squeeze-out is led into the overflow space 31 without winding up on the outer side of the packaging base 24 thus to maintain the neat appearance of the packaging base.

Figure 9:
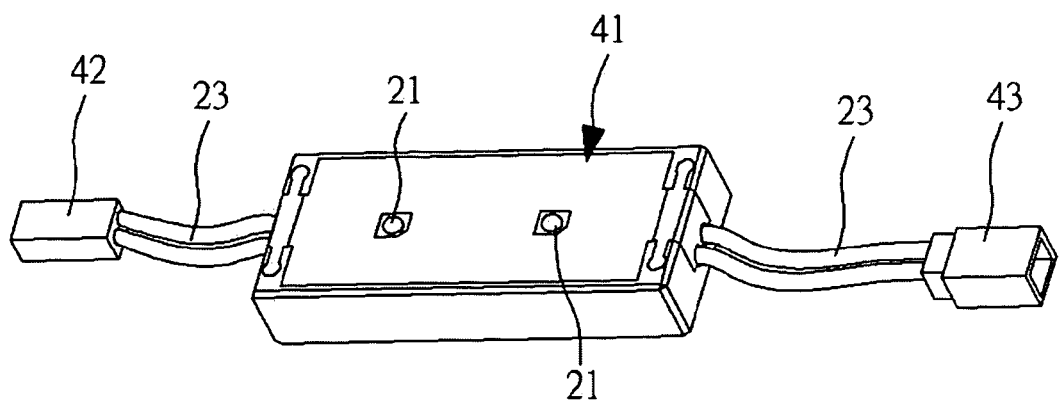
FIG. 9 is another perspective view showing an LED unit in the present invention.
Figure 10:
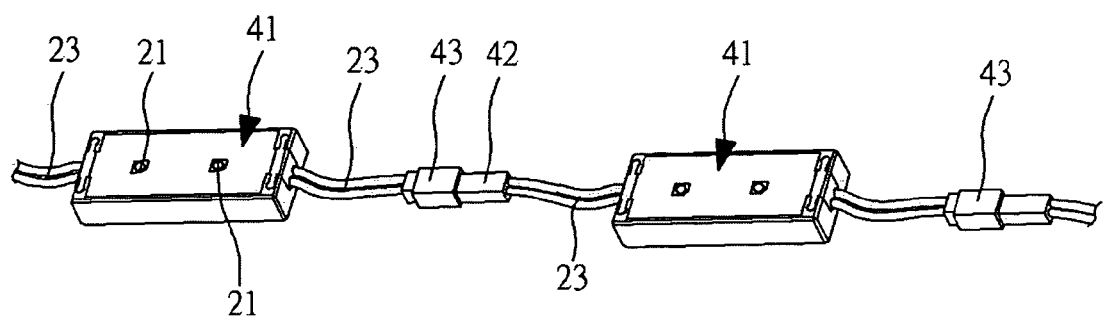
FIG. 10 is a perspective view of a lighting source installation in the present invention.
Figure 11:
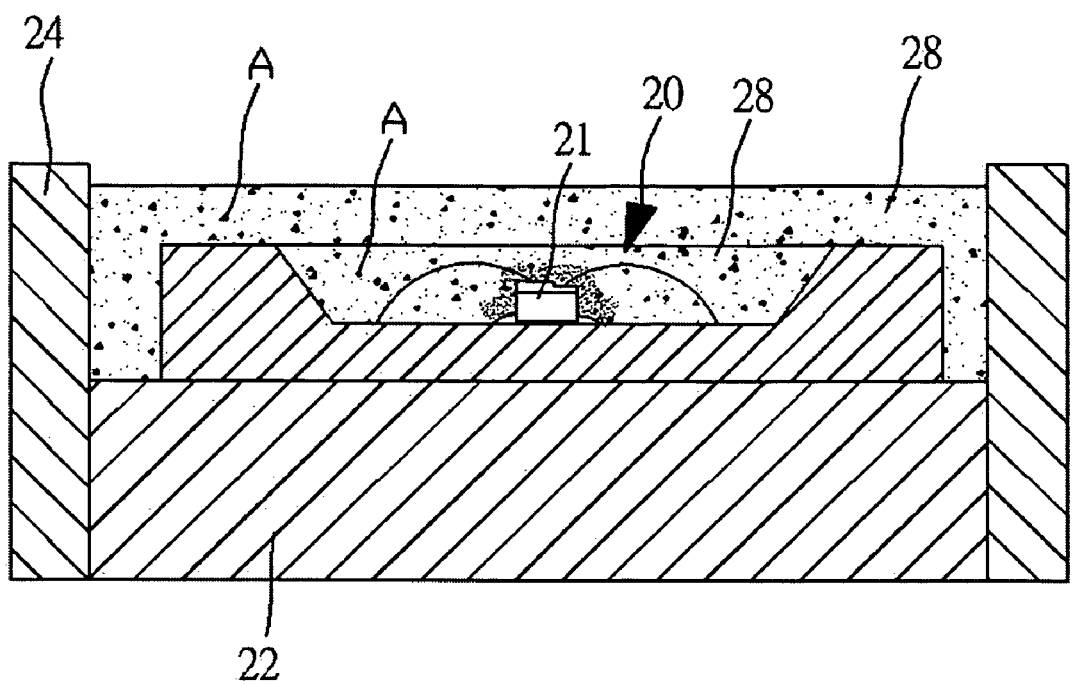
FIG. 11 is a schematic view showing a construction of the LED unit and the packaging colloid in the present invention.

Furthermore, as illustrated in FIG. 9, both circuits 23 respectively provided on both sides of the substrate 22 of the light emitting packaging unit 41 are each disposed with a male and a female connectors 42, 43 to allow interconnections among light emitting packaging units 41. When each circuit 23 is conducted, the light-emitting chip is activated to become a light source as illustrated in FIG. 10. Alternatively, the chip 21 may be replaced with the LED unit 20 already completed with the packaging process, FIG. 11. The color of the light emitted by each LED unit 20 may be the same as or different from that emitted by other LED units to be applied in an advertising light box or on a signboard.

The prevent invention provides an improved structure of a chip packaging overflow-proof device, and the application for a utility patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

I claim:

1. A chip packaging overflow proof device comprising:
   a substrate, one or a plurality of chip disposed on the substrate;
   a packaging base to accommodate the substrate and the chip;
   a circuit disposed on the side of the substrate and connected to the chip;
   a socket disposed on the side of the packaging base;
   a lid inserted into the socket;
   a retaining wall disposed on the packaging base at where closer to the socket;
   a first cable-terminating hole disposed at where between the socket and the lid for the circuit to penetrate through; and
   a second cable-terminating hole disposed on the retaining wall; and
   an overflow space being defined between the retaining wall and the socket at a level lower than that of the second cable-terminating hole, the overflow space being integrated with the packaging base,
   wherein any squeeze-out of a colloid packaging of the chip being admitted into the overflow space,
   wherein a trough is disposed on the retaining wall, a first covering portion extending from the lid enters into the overflow space and a second covering portion extending from the lid enters into the trough,
   wherein the second cable-terminating hole is contained in the first slot with its opening facing upward and disposed on the bottom of the trough and in a second slot with its opening facing downward and disposed on the bottom of the lid.

2. The chip packaging overflow proof device as claimed in claim 1, wherein the substrate relates to a circuit board.

3. The chip packaging overflow proof device as claimed in claim 1, wherein the packaging base contains a chamber to accommodate the base and multiple ribs to secure the substrate in position.

4. The chip packaging overflow proof device as claimed in claim 1, wherein the first cable-terminating hole is contained in a first slot with its opening facing upward and disposed on the bottom of the socket and in a second slot with its opening facing downward and disposed on the bottom of the lid.

5. The chip packaging-overflow proof device as claimed in claim 1, wherein an arc portion is disposed between the overflow space and the first covering portion for the overflow space and the first covering portion to be abutted to each other.

6. A light emitting packaging unit comprising:
   a substrate;
   one or a plurality of light emitting diode (LED) unit disposed on the substrate; a circuit disposed on one side of the substrate and connected to the LED unit;
   a packaging base to accommodate the substrate and the LED unit;
   a socket disposed on one side of the packaging base;
   a lid inserted into the socket;
   a retaining wall disposed on the packaging base at where closer to the socket;
   a first cable-terminating hole disposed at where between the socket and the lid to permit the circuit to penetrate through;
   a second cable-terminating hole disposed on the retaining wall; an overflow space being defined between the retaining wall and the socket; and
   the bottom of the overflow space being provided at a level lower than that of the second cable-terminating hole, the overflow space being integrated with the packaging base,
   wherein any squeeze-out from a packaging colloid of the LED unit being admitted to the overflow space, wherein a trough is disposed on the retaining wall, and a first covering portion extending from the lid enters into the overflow space, and a second covering portion extending from the lid enters into the trough, wherein the second cable-terminating hole is contained in the first slot with its opening facing upward and disposed on the bottom of the trough and in a second slot with its opening facing downward and disposed on the bottom of the second covering portion.

7. The light emitting packaging unit as claimed in claim 6, wherein a chamber is provided in the packaging base to accommodate the substrate and multiple ribs to secure the substrate.

8. The light emitting packaging unit as claimed in claim 6, wherein the first cable-terminating hole is contained in a first slot with its opening facing upward and disposed on the bottom of each of both sides of the socket and in a second slot with its opening facing downward and disposed on the bottom of each of both sides of the lid.

9. The light emitting packaging unit as claimed in claim 6, wherein an arc portion is disposed at where between the overflow space and the first covering portion for both of the overflow space and the first covering portion to be abutted to each other.

10. The light emitting packaging unit as claimed in claim 6, wherein the color of the light emitted from each LED unit is the same as or different from that of any other LED unit.

11. The light emitting packaging unit as claimed in claim 6, wherein fluorescent powder in different color is added into the packaging colloid.

12. The light emitting packaging unit as claimed in claim 6, wherein the circuit is provided with a connector.

13. A light source includes multiple light emitting packaging units as claimed in claim 6, wherein the circuit is provided with one or a plurality of connector.

14. The light source as claimed in claim 13, wherein the color of the light emitted from each light emitting packaging unit is the same as or different from that of any other light emitting packaging unit.

15. A light source includes multiple chip packaging overflow proof devices as claimed in claim 1, wherein the chip is a light emitting chip and the circuit is provided with one or a plurality of connector.

16. The light source as claimed in claim 15, wherein the color of the light emitted from each light emitting chip is the same as or different from that of any other light emitting chip.

* * * * *